United States Patent [19]

Mori et al.

[11] Patent Number: 4,632,794
[45] Date of Patent: Dec. 30, 1986

[54] PROCESS FOR MANUFACTURING WHISKER PREFORM FOR COMPOSITE MATERIAL

[75] Inventors: Shigeto Mori; Minoru Fukazawa, both of Nagoya, Japan

[73] Assignee: Tokai Carbon Co., Ltd., Tokyo, Japan

[21] Appl. No.: 559,934

[22] Filed: Dec. 8, 1983

[30] Foreign Application Priority Data

Dec. 25, 1982 [JP] Japan ............... 57-226545

[51] Int. Cl.$^4$ ............... B28B 1/26
[52] U.S. Cl. ............... 264/87; 264/109; 264/DIG. 78
[58] Field of Search .......... 264/87, 109, 301, DIG. 78

[56] References Cited

U.S. PATENT DOCUMENTS

| 3,275,497 | 9/1966 | Weiss ............... 264/87 |
| 3,476,641 | 11/1969 | Milewski . |
| 3,649,406 | 3/1972 | McNish ............... 264/87 |
| 3,697,634 | 10/1972 | Staudhammer et al. ........... 264/109 |
| 3,935,060 | 1/1976 | Blome ............... 264/87 |
| 4,313,789 | 2/1982 | Frahme ............... 264/87 |

FOREIGN PATENT DOCUMENTS 1282096 7/1972 United Kingdom .

OTHER PUBLICATIONS

Chaille, "Ceramic Fiber Board Linings for Furnaces Operating at 1200°-1400° C.", *Ceramic Bulletin*, vol. 60, No. 7, (1981), pp. 695-699.

*Primary Examiner*—Donald Czaja
*Assistant Examiner*—Mary Lynn Fertig
*Attorney, Agent, or Firm*—Birch, Stewart, Kolasch & Birch

[57] ABSTRACT

In a process for manufacturing a whisker preform for a composite material, a dispersion of a whisker in water or an organic solvent is passed through a sieve and is filtered, and a residual wet whisker cake is dried, with or without prior compression, to produce a cake having a desired density based upon the relationship between the weight of the whisker in the dispersion and the volume of the residual whisker cake after filtration.

3 Claims, No Drawings

PROCESS FOR MANUFACTURING WHISKER PREFORM FOR COMPOSITE MATERIAL

BACKGROUND OF THE INVENTION

The present invention relates to a process for manufacturing a whisker preform to be used as a fibrous base in the manufacture of a whisker reinforced composite material by infiltrating or impregnating a whisker with a matrix material such as a metal, alloy or plastic.

Various types of whiskers consisting of single crystals of SiC, $Si_3N_4$ or graphite have, as inherent properties, extremely high standards of strength, elastic modulus, heat resistance, and chemical stability. For this reason, whiskers have been long considered as promising reinforcing material of metals or plastics. In spite of this, whiskers have not actually been used as reinforcing materials of metals or plastics in a practical sense. The most important technical reason for this is the difficulty in obtaining a uniform dispersion of a whisker in a matrix material. More specifically, various types of whiskers have been prepared by high temperature reaction of raw materials. The resultant products have a structural form in which dense, short fibrous whiskers entangle each other in a random manner and cannot be easily disentangled. This has impaired the uniform dispersion of a whisker in a matrix material and has prevented the practical use of a whisker as a reinforcing material.

It has been found that a structural form of a whisker may be transformed into a sponge-like cake form having an extremely uniform pore structure, depending upon the selection of the reaction system. Based on this finding, a manufacturing technique of a SiC whisker reinforced composite material had been proposed (Japanese Patent Application No. 57-130293) wherein the sponge-like cake of the resultant whisker is used as a fibrous base and a matrix material is introduced into the fibrous base. However, with this technique, if the preparation conditions of the whisker are not controlled under strict restrictions, a uniform structural base cannot be formed and properties of the resultant composite material sometimes suffer local variations (due to segregation).

SUMMARY OF THE INVENTION

It is an object of the present invention to provide a process for manufacturing a whisker preform for a composite material, which eliminates the problems of conventional techniques and which imparts uniform properties to composite materials.

In order to achieve this object of the present invention, there is provided a process for manufacturing a whisker preform for a composite material, characterized in that a dispersion of a whisker in water or an organic solvent is first passed through a sieve and is then filtered, and the residual wet whisker cake is dried, with or without prior compression, to have a predetermined density before drying.

A whisker preform manufactured according to this process has an extremely uniform structure and is integrally formed so as not to allow any disintegrate after being dried.

DETAILED DESCRIPTION OF THE PREFERRED EMBODIMENTS

In order to manufacture a preform which is uniformly dispersed and is hard to disintegrate and which imparts good properties to a composite material, a whisker as a raw material to be used herein is SiC, $Si_3N_4$ or graphite which is in single crystal form having a diameter of 0.1 to 5 $\mu$m and a length of 10 to 500 $\mu$m. A whisker of raw material generally has a structural form of an aggregate cake wherein short fibrous whiskers entangle each other in a random manner. The whisker is disentangled or compressed and is then added to water or an organic solvent such as an alcohol, acetone, or an ether. The mixture is stirred using a stirrer such as a mixer or a magnetic stirrer until the whisker is uniformly dispersed. The water or organic solvent is preferably used in an amount of 7 to 200 times (based on weight ratio) that of the whisker for easy processing. When the amount of water or organic solvent used is less than 7 times that of the whisker, the dispersion of the whisker is unsatisfactory. On the other hand, if the amount of water or organic solvent exceeds 200 times that of the whisker, the filtering step becomes time consuming.

The dispersion is passed through a sieve to separate out any insufficiently dispered aggregates of the whisker. The sieve preferably has a mesh of 32 to 100 mesh. If the mesh of the sieve used is coarser than 32 mesh, small cakes of entangled whisker may be allowed to pass through the sieve. On the other hand, if the mesh of the sieve exceeds 100 mesh, effective components of the whisker may also be separated out upon sieving.

The dispersion after sieving is filtered with a filter such as a filter paper or a glass filter so as to fractionate the water or an organic solvent as a dispersion medium as a filtrate. The residual wet whisker is a cake generally having a porosity (after drying) of 75 to 95%. The wet whisker cake is dried with or without prior compression. [By prior compression it is compressed to a desired density (e.g., 0.96 g/cm$^3$) in a mold in consideration of the Vf value (volume fraction), shape and the like of a composite material.]

In a whisker preform obtained in this manner, the uniform whisker is randomly oriented in a two-dimensional plane, has an extremely uniform, structure, and is integral so as not to disintegrate after being dried.

A composite material such as a FRP (fiber reinforced plastic) or a FRM (fiber reinforced metal) is then prepared by infiltrating or impregnating a whisker preform obtained in this manner as a fibrous base with a matrix material. A matrix material can be selected from metals such as Mg, Al, Si, Ti, Cr, Mn, Fe, Co, Ni, Cu, Zn, Ag, Ta, or W, and alloys thereof; and various plastics such as thermosetting resins, e.g., an epoxy resin, an unsaturated polyester resin, a phenol resin, a polyimide resin, or a urea resin, or thermoplastic resins, e.g., a vinyl chloride resin, a polyethylene, a polypropylene, a polyamide, a polyacetal, a polycarbonate, or a saturated polyester resin. The whisker preform of the present invention can impart uniform and good reinforcing properties and has little local variation. Accordingly, the whisker preform of the present invention can contribute significantly to mass production of various types of composite materials for structural and functional materials for aircraft turbines, automobile engines, buildings, and leisure equipment.

PREFERRED EMBODIMENTS

The present invention will now be described by way of its examples.

EXAMPLE 1

A mixture of a silicon source material and a carbonaceous material was filled in a reaction vessel. After the reaction vessel was kept at 1,600° C. for four hours in a heating furnace held in a non-oxidizing atmosphere, the remaining carbonaceous material was burnt off. A sponge-like whisker cake (i.e., raw material) was obtained which is a $\beta$-type SiC whisker cake having a diameter of 0.5 to 1.5 $\mu$m and a length of 10 to 300 $\mu$m, and had an apparent density of 0.04 g/cm$^3$ and an average porosity of 98.7%.

The sponge-like whisker cake was compressed. Eighty-four grams of the compressed whisker were placed in a juicer/mixer together with 2,000 ml of pure water. The juicer/mixer was operated for 10 seconds to disperse the whisker in the pure water. The dispersion was passed through a sieve of 55 mesh and was then filtered through a filter paper having a diameter of 200 mm and set in a suction filter. The residual wet whisker cake (8 mm thickness; 91% porosity after drying) was separated from the filter paper and was then cut with a cutter into ten samples each having a width of 10 mm and a length of 120 mm. Each sample was compressed in a mold in the wet state and then dried so as to provide a whisker preform having an apparent density of 0.63 g/cm$^3$, a width of 10 mm, a length of 120 mm and a thickness of 4 mm.

Each whisker preform thus obtained was used as a fibrous base for vacuum impregnation with an epoxy resin solution. The impregnated whisker preform was hot-pressed to provide an FRP. Each resultant FRP was measured for its apparent density, flexural modulus, and flexural strength, and the obtained measurements are shown together with standard deviations in Table 1 below.

For the purpose of comparison, the other sponge-like cake of SiC whisker (i.e., raw material) obtained in the above process was compressed to an apparent density of 0.63 g/cm$^3$ and was sliced into ten fibrous base samples each having a width of 10 mm, a length of 120 mm and a thickness of 4 mm. Each sample was similarly impregnated with an epoxy resin matrix. The same properties of each resultant FRP were measured as for the samples of Example 1 above, and the obtained results are shown in Table 1 as Comparative Example 1.

TABLE 1

| | Fibrous base | | | | | |
|---|---|---|---|---|---|---|
| | Example 1 | | | Comparative Example 1 | | |
| | Properties | | | | | |
| No. | Apparent density (g/cm$^3$) | Flexural modulus (kg/mm$^2$) | Flexural strength (kg/mm$^3$) | Apparent density (g/cm$^3$) | Flexural modulus (kg/mm$^2$) | Flexural strength (kg/mm$^2$) |
| 1 | 1.604 | 980 | 16.0 | 1.602 | 826 | 14.2 |
| 2 | 1.601 | 1,005 | 16.7 | 1.598 | 754 | 13.6 |
| 3 | 1.605 | 1,062 | 16.9 | 1.596 | 895 | 15.6 |
| 4 | 1.605 | 998 | 15.9 | 1.598 | 981 | 14.1 |
| 5 | 1.601 | 1,024 | 16.0 | 1.610 | 968 | 16.0 |
| 6 | 1.602 | 993 | 16.4 | 1.598 | 890 | 14.2 |
| 7 | 1.598 | 1,023 | 16.5 | 1.590 | 765 | 13.8 |
| 8 | 1.604 | 1,011 | 15.7 | 1.603 | 916 | 15.1 |
| 9 | 1.600 | 981 | 15.6 | 1.599 | 792 | 12.8 |
| 10 | 1.592 | 986 | 16.0 | 1.605 | 923 | 15.5 |
| Average value (X) | 1.601 | 1,006 | 16.2 | 1.600 | 871 | 14.5 |
| Standard deviation ($\sigma$) | $4 \times 10^{-3}$ | 24 | 0.4 | $5 \times 10^{-3}$ | 78 | 1.0 |

It is seen from Table 1 above that the FRP prepared using the SiC whisker preforms of Example 1 of the present invention had small variations in strength, uniform overall structures, and better flexural modulus and flexural strength than those of the FRP prepared using the SiC whisker preforms of Comparative Example 1.

FRP similarly prepared using Si$_3$N$_4$ and graphite whiskers under similar conditions to those above were measured for the same properties, and similar results to those obtained above were obtained.

EXAMPLE 2

A sponge-like cake of an SiC whisker (i.e., raw material) having the same properties as those of Example 1 was disentangled. One hundred grams of the disentangled whisker were added to 1,000 ml of ethyl alcohol, and the mixture was stirred to provide a uniform dispersion. The resultant dispersion was passed through a sieve having a 55 mesh, and was then vacuum-filtered through a filter paper having a diameter of 50 mm. The residual wet whisker cake (91% porosity after drying) was separated from the filter paper and was then dried to provide a columnar whisker preform having an apparent density of 0.283 g/cm$^3$, a diameter of 50 mm and a height of 200 mm.

The whisker preform was sliced to provide five fibrous base samples each having a thickness of 40 mm. Each sample was infiltrated with molten pure aluminum at a pressure of 1 ton/cm$^2$ to provide an FRM. Each FRM was measured for its apparent density, tensile modulus, and tensile strength, and obtained measurements are shown in Table 2 below together with standard deviations.

For the purpose of comparison, the other sponge-like cake of SiC whisker (i.e., raw material) as used in Example 2 was compressed to provide a columnar cake having an apparent density of 0.63 g/cm$^3$, a diameter of 50 mm and a height of 200 mm. The cake was sliced to provide fibrous base samples each having a thickness of 40 mm. Each sample was infiltrated with molten pure aluminum at a pressure in the same manner as described above. The properties of the resultant FRM are also shown in Table 2 as Comparative Example 2.

TABLE 2

| | Fibrous base | | | | | |
|---|---|---|---|---|---|---|
| | Example 2 | | | Comparative Example 2 | | |
| | Properties | | | | | |
| No. | Apparent density (g/cm³) | Tensile modulus (kg/mm²) | Tensile strength (kg/mm²) | Apparent density (g/cm³) | Tensile modulus (kg/mm²) | Tensile strength (kg/mm²) |
| 1 | 2.755 | 9,200 | 18.8 | 2.841 | 12,100 | 33.1 |
| 2 | 2.763 | 9,300 | 18.9 | 2.815 | 11,500 | 29.5 |
| 3 | 2.756 | 9,200 | 17.9 | 2.783 | 10,000 | 24.3 |
| 4 | 2.760 | 9,100 | 18.3 | 2.911 | 12,500 | 39.2 |
| 5 | 2.759 | 9,300 | 18.5 | 2.795 | 11,900 | 27.5 |
| Average value ($\bar{X}$) | 2.759 | 9,220 | 18.5 | 2.829 | 11,600 | 30.7 |
| Standard deviation ($\sigma$) | $3 \times 10^{-3}$ | 75 | 0.4 | $45 \times 10^{-3}$ | 863 | 5.1 |

The Vf value of the FRM of Example 2 is 12.8% while that of Comparative Example 2 is 27.7%. The strength of Comparative Example 2 is seen in Table 2 to be higher than that of Example 2. However, the FRM of Example 2 has significantly small variations in various properties and has a uniform structure free of segregation.

ple 3 was compressed to an apparent density of 0.346 g/cm³. The obtained fibrous base sample was cut into ten samples of the same dimensions as those above to provide FRP.

Each FRP obtained was also measured for its properties, and the obtained results are also shown in Table 3 below as Comparative Example 3.

TABLE 3

| | Fibrous base | | | | | |
|---|---|---|---|---|---|---|
| | Example 3 | | | Comparative Example 3 | | |
| | Properties | | | | | |
| No. | Apparent density (g/cm³) | Flexural modulus (kg/mm²) | Flexural strength (kg/mm²) | Apparent density (g/cm³) | Flexural modulus (kg/mm²) | Flexural strength (kg/mm²) |
| 1 | 1.471 | 753 | 14.8 | 1.475 | 751 | 14.3 |
| 2 | 1.470 | 731 | 15.2 | 1.465 | 718 | 13.8 |
| 3 | 1.470 | 728 | 15.1 | 1.471 | 727 | 15.0 |
| 4 | 1.470 | 725 | 15.1 | 1.476 | 692 | 15.1 |
| 5 | 1.473 | 742 | 15.2 | 1.470 | 713 | 15.0 |
| 6 | 1.471 | 725 | 14.7 | 1,472 | 741 | 14.1 |
| 7 | 1.470 | 719 | 14.9 | 1.468 | 720 | 14.8 |
| 8 | 1.472 | 756 | 15.3 | 1.477 | 713 | 14.5 |
| 9 | 1.470 | 731 | 15.1 | 1.468 | 695 | 13.6 |
| 10 | 1.472 | 726 | 15.0 | 1.473 | 759 | 14.7 |
| Average value ($\bar{X}$) | 1.471 | 734 | 15.0 | 1.472 | 723 | 14.5 |
| Standard deviation ($\sigma$) | $1 \times 10^{-3}$ | 12 | 0.2 | $4 \times 10^{-3}$ | 21 | 0.5 |

EXAMPLE 3

A sponge-like cake of β-type SiC whisker (i.e., raw material) having a diameter of 0.5 to 1.5 μm and a length of 10 to 300 μm prepared in the same manner as in Example 1 was compressed. Twenty grams of the cake were added to 2,000 ml of ethyl alcohol, and the mixture was stirred to provide a uniform dispersion. After the dispersion was passed through a sieve of 55 mesh, it was vacuum-filtered through a simple filter having inner dimensions of 120×110 mm. The residual wet whisker cake (4.4 mm thickness; 89.1% porosity after drying) was cut into ten samples each having a length of 120 mm and a width of 10 mm. Each sample was dried to provide a whisker preform having an apparent density of 0.346 g/cm³, a length of 120 mm, a width of 10 mm and a thickness of 4.4 mm.

FRP were prepared using the whisker preforms obtained in this manner in accordance with the same procedures as in Example 1.

Each FRP was measured for its apparent density, flexural modulus, and flexural strength, and the obtained results are shown in Table 3 below.

For the purpose of comparison, the other sponge-like cake of SiC whisker (i.e., raw material) as used in Exam-

EXAMPLE 4

One hundred and forty grams of the same sponge-like cake of SiC whisker (i.e., raw material) as that used in Example 2 were dispersed in 1,500 ml of ethyl alcohol in the same manner as that of Example 2. The resultant dispersion was passed through a sieve of 80 mesh and was filtered under suction using a filter paper having a diameter of 50 mm. The residual wet whisker cake (89% porosity after drying) was separated from the filter paper and was dried to provide a columnar whisker preform having an apparent density of 0.350 g/cm³, a diameter of 50 mm, and a height of 204 mm.

The preform was sliced into five samples as in Example 2 and each sample was infiltrated with magnesium at a pressure to provide an FRM.

Each FRM obtained was measured for its apparent density, tensile modulus, and tensile strength, and the obtained results are shown in Table 4 below.

For the purpose of comparison, the other sponge-like cake of SiC whisker (i.e., raw material) as used in Example 4 was compressed to provide a columnar cake having an apparent density of 0.350 g/cm³, a diameter of 50 mm and a height of 204 mm. The cake was sliced into fibrous base samples each having a thickness of 40 mm. Each sample was infiltrated with magnesium at a pressure to provide an FRM. The properties of the resultant FRM were measured, and the obtained results are shown in Table 4 as Comparative Example 4.

TABLE 4

| | Fibrous base | | | | | |
|---|---|---|---|---|---|---|
| | Example 4 | | | Comparative Example 4 | | |
| | Properties | | | | | |
| No. | Apparent density (g/cm³) | Tensile modulus (kg/mm²) | Tensile strength (kg/mm²) | Apparent density (g/cm³) | Tensile modulus (kg/mm²) | Tensile strength (kg/mm²) |
| 1 | 1.926 | 5,780 | 14.2 | 1.915 | 5,500 | 10.1 |
| 2 | 1.925 | 5,840 | 15.8 | 1.942 | 5,780 | 15.5 |
| 3 | 1.918 | 5,750 | 14.5 | 1.926 | 5,450 | 12.8 |
| 4 | 1.936 | 5,800 | 14.3 | 1.930 | 5,810 | 14.6 |
| 5 | 1.931 | 5,790 | 15.1 | 1.928 | 5,430 | 12.5 |
| Average value (X) | 1.927 | 5,792 | 14.8 | 1.928 | 5,594 | 13.1 |
| Standard deviation (σ) | $6.8 \times 10^{-3}$ | 33 | 0.7 | $9.7 \times 10^{-3}$ | 186 | 2.1 |

EXAMPLE 5

A sponge-like cake of a SiC whisker (i.e., raw material) having the same properties as those of Example 1 was compressed. Nine hundred and forty-three grams of the cake were stirred with 7,000 ml of pure water to provide a uniform dispersion. The dispersion was passed through a sieve of 55 mesh and was filtered with a square filter paper having a side of 300 mm using a suction filter. The residual wet whisker cake (30 mm thickness; 89% porosity after drying) was placed in a square mold having a side of 300 mm. After placing a square filter paper having a side of 300 mm therein, the cake was compressed. The cake was dried after the filter paper was removed, and then a square whisker preform was provided which had an apparent density of 0.70 g/cm³, a side of 300 mm and a thickness of 15 mm. The thus obtained whisker preform was sandwiched between two square polyamide plates each having a side of 300 mm and a thickness of 3 mm, placed in a mold for hot press, and heated in a non-oxidizing atmosphere. After the polyamide was melted, compression was performed to provide a square FRP having a side of 300 mm and a thickness of 8 mm. The FRP was cut into samples for which apparent density, flexural modulus and flexural strength were measured. The obtained results and standard deviations are shown in Table 5 below.

For the purpose of comparison, the other sponge-like cake of SiC whisker (i.e., raw material) as used in Example 5 was compressed to provide a preform which was then used for preparing FRP under the same conditions as those prepared above. The resultant FRP were measured for the same properties as those of Example 5 above. The obtained results are also shown in Table 5 below.

TABLE 5

| | Fibrous base | | | | | |
|---|---|---|---|---|---|---|
| | Example 5 | | | Comparative Example 5 | | |
| | Properties | | | | | |
| No. | Apparent density (g/cm³) | Flexural modulus (kg/mm²) | Flexural strength (kg/mm²) | Apparent density (g/cm³) | Flexural modulus (kg/mm²) | Flexural strength (kg/mm²) |
| 1 | 1.943 | 3,620 | 72 | 1.941 | 3,590 | 62 |
| 2 | 1.943 | 3,650 | 73 | 1.935 | 3,580 | 62 |
| 3 | 1.942 | 3,720 | 70 | 1.949 | 3,810 | 60 |
| 4 | 1.948 | 3,830 | 70 | 1.945 | 3,780 | 63 |
| 5 | 1.942 | 3,750 | 72 | 1.946 | 3,730 | 65 |
| 6 | 1.945 | 3,770 | 71 | 1.939 | 3,610 | 62 |
| 7 | 1.946 | 3,800 | 75 | 1.932 | 3,690 | 68 |
| 8 | 1.946 | 3,860 | 73 | 1.943 | 3,700 | 66 |
| 9 | 1.942 | 3,750 | 72 | 1.941 | 3,720 | 67 |
| 10 | 1.949 | 3,820 | 74 | 1.938 | 3,570 | 60 |
| Average value (X) | 1.945 | 3,760 | 72 | 1.941 | 3,680 | 64 |
| Standard deviation (σ) | $2 \times 10^{-3}$ | 73 | 1.5 | $5 \times 10^{-3}$ | 82 | 2.7 |

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A process for manufacturing a whisker preform for a composite material having a density of 0.283–0.70 g/cm³, comprising the steps of:
   (1) compressing a whisker as a raw material consisting of SiC single crystals having a diameter of 0.1–5 μm and a length of 10–500 μm;
   (2) dispersing the compressed whisker in water or an organic solvent in the absence of a binder, the amount of the water or organic solvent being 7–200 times as much by weight as the amount of the whisker;
   (3) passing the resultant dispersion through a sieve having a mesh of 32–100;

(4) filtering said dispersion; and (5) drying the residual wet whisker cake directly or after compression to said desired density.

2. A process according to claim 1, wherein said whisker is dispersed in said water or organic solvent after being disentangled.

3. A process according to claim 1, wherein said whisker is dispersed in an organic solvent selected from the group consisting of alcohol, acetone, and an ether.

* * * * *